US012685192B2

(12) United States Patent
Lye et al.

(10) Patent No.: US 12,685,192 B2
(45) Date of Patent: Jul. 14, 2026

(54) SEMICONDUCTOR DEVICE QUAD-FLAT-NO-LEADS PACKAGE WITH TRENCHES FOR IMPROVED SOLDERING AND METHOD OF MAKING THEREOF

(71) Applicant: NXP USA, INC., Austin, TX (US)

(72) Inventors: Meng Kong Lye, Shah Alam (MY); Zhijie Wang, Tianjin (CN); You Ge, Tianjin (CN); Zhiming Li, Tianjin (CN)

(73) Assignee: NXP USA, Inc., Austin, TX (US)

( * ) Notice: Subject to any disclaimer, the term of this patent is extended or adjusted under 35 U.S.C. 154(b) by 470 days.

(21) Appl. No.: 17/932,481

(22) Filed: Sep. 15, 2022

(65) Prior Publication Data

US 2023/0115182 A1    Apr. 13, 2023

(30) Foreign Application Priority Data

Oct. 8, 2021    (CN) ........................... 202111172811.6

(51) Int. Cl.
  *H10W 70/65*         (2026.01)
  *H10W 70/04*         (2026.01)
         (Continued)

(52) U.S. Cl.
  CPC ......... *H10W 70/65* (2026.01); *H10W 70/042* (2026.01); *H10W 70/048* (2026.01);
         (Continued)

(58) Field of Classification Search
  CPC ........... H01L 23/49838; H01L 21/4828; H01L 21/4842; H01L 23/49805; H01L 24/48;
         (Continued)

(56) References Cited

U.S. PATENT DOCUMENTS 7,087,462 B1 *  8/2006  Park .................. H01L 23/49582
                                                      438/461
8,067,030 B2    11/2011  Dirks et al.
                  (Continued)

FOREIGN PATENT DOCUMENTS

JP        2003078100 A      3/2003

*Primary Examiner* — Norman D Richards
*Assistant Examiner* — Sean Ayers Winters

(57)                 ABSTRACT

According to a first aspect of the present invention there is provided a quad-flat-no-leads (QFN) packaged semiconductor device having a QFN bottom surface and QFN side faces, wherein the QFN side faces each comprise an upper portion and a recessed lower portion, the QFN packaged semiconductor device comprising: a die pad within or on the QFN bottom surface; a plurality of I/O terminals spaced apart from the die pad and around a periphery of the bottom surface, each having a bottom face extending from an inner end to a peripheral end, an exposed side face on a QFN side face and extending above the recessed lower portion of the QFN side face; wherein the QFN bottom surface includes at least one trench therein, parallel to a one of the QFN side faces and exposing at least a part of a side face of the inner end of the I/O terminals. The trench may provide for additional surface area, and provide a stronger solder joint when the QFN packaged semiconductor device is soldered to a substrate or circuit board.

10 Claims, 3 Drawing Sheets

(51) Int. Cl.
  H10W 74/00      (2026.01)
  H10W 90/00      (2026.01)

(52) U.S. Cl.
  CPC ........ *H10W 70/657* (2026.01); *H10W 70/047*
    (2026.01); *H10W 74/00* (2026.01); *H10W*
    *90/756* (2026.01)

(58) Field of Classification Search
  CPC ....... H01L 21/4839; H01L 2224/48091; H01L
    2224/48245; H01L 2924/182; H10W
    70/65; H10W 70/042; H10W 70/048;
    H10W 70/657; H10W 70/047; H10W
    90/756; H10W 74/00
  See application file for complete search history.

(56)               References Cited

U.S. PATENT DOCUMENTS

|  |  |  |
|---|---|---|
| 9,177,836 B1 | 11/2015 | Liu et al. |
| 9,391,007 B1 | 7/2016 | Yeung et al. |
| 10,199,312 B1 | 2/2019 | Rivera-Marty |

| | | | |
|---|---|---|---|
| 2003/0020147 A1* | 1/2003 | Kobayakawa | H01L 24/83 |
| | | | 257/E21.516 |
| 2007/0126092 A1* | 6/2007 | San Antonio | H01L 21/568 |
| | | | 438/123 |
| 2009/0085184 A1* | 4/2009 | Song | H01L 25/105 |
| | | | 257/E23.18 |
| 2011/0068463 A1* | 3/2011 | Camacho | H01L 23/49541 |
| | | | 257/713 |
| 2012/0009737 A1* | 1/2012 | Kuratomi | H01L 24/97 |
| | | | 438/123 |
| 2012/0292755 A1 | 11/2012 | Wang | |
| 2014/0357022 A1 | 12/2014 | Stacey | |
| 2015/0262918 A1 | 9/2015 | Tran et al. | |
| 2016/0254214 A1* | 9/2016 | Makino | H01L 23/49582 |
| | | | 257/676 |
| 2016/0358845 A1 | 12/2016 | Liu et al. | |
| 2017/0162489 A1 | 6/2017 | Javier et al. | |
| 2019/0035685 A1* | 1/2019 | Bin Mohd Arshad | |
| | | | H01L 21/4842 |
| 2019/0148270 A1* | 5/2019 | Rivera-Marty | H01L 24/97 |
| | | | 257/676 |
| 2019/0385938 A1 | 12/2019 | Shi | |
| 2020/0098672 A1* | 3/2020 | Hayashi | H01L 24/16 |

* cited by examiner

SEMICONDUCTOR DEVICE QUAD-FLAT-NO-LEADS PACKAGE WITH TRENCHES FOR IMPROVED SOLDERING AND METHOD OF MAKING THEREOF

CROSS-REFERENCE TO RELATED APPLICATIONS

This application claims the priority under 35 U.S.C. § 119 of China application no. 202111172811.6, filed on 8 Oct. 2021, the contents of which are incorporated by reference herein.

FIELD

This disclosure relates to integrated circuit (IC) packaging. More particularly, this disclosure relates to a quad-flat-no-leads (QFN) packaged semiconductor devices and a method of making thereof.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of devices per given area of the silicon wafer increases, the manufacturing process becomes more difficult.

One significant challenge in the mounting of devices onto a printed circuit board (PCB) is maintaining the integrity of the solder connection between I/O terminals of the device and corresponding landings on the PCB. One bad solder connection may render a complex device useless. Thus, it may be important to improve the Board Level Reliability (BLR) and Solder Joint Reliability (SJR).

SUMMARY

According to a first aspect of the present invention there is provided a quad-flat-no-leads (QFN) packaged semiconductor device having a QFN bottom surface and QFN side faces, wherein the QFN side faces each comprise an upper portion and a recessed lower portion, the QFN packaged semiconductor device comprising: a die pad within or on the QFN bottom surface; a plurality of I/O terminals spaced apart from the die pad and around a periphery of the bottom surface, each having a bottom face extending from an inner end to a peripheral end, an exposed side face on a QFN side face and extending above the recessed lower portion of the QFN side face; wherein the QFN bottom surface includes at least one trench therein, parallel to a one of the QFN side faces and exposing at least a part of a side face of the inner end of the I/O terminals. The trench may provide for additional surface area, and provide a stronger solder joint when the QFN packaged semiconductor device is soldered to a substrate or circuit board.

In one or more embodiments, the at least one trench comprises a respective trench parallel to each of the QFN side faces. In other embodiments, a respective trench may be provided parallel to 2 of the QFN side faces. Providing a respective trench parallel to each of the side faces may provide a better lock and yet stronger joint.

In one or more embodiments a depth of the trench is less than a height of the lower portion of the QFN side face.

In one or more embodiments the I/O terminal further comprises a buried portion extending from the inner end towards the die pad, and spaced apart therefrom. The I/O terminal may thus have a first thickness between the inner end and the peripheral end, and a second thickness, less than the first thickness, in the buried portion. Such a two-thickness I/O terminal may be beneficial in that it may allow molding compound to surround the buried portion, thereby providing stronger or more robust encapsulation for the device.

In one or more embodiments a depth of the trench is less than a difference between the first thickness and the second thickness.

In one or more embodiments a depth of the trench is more than a difference between the first thickness and the second thickness, and less than the first thickness. In such embodiments, the formation of the trench whether by sawing or laser cut includes cutting into the buried portion of the I/O terminals. Whereas this might weaken the material, it potentially results in a larger surface area for the solder to key to and thus some joints.

According to another aspect of the present disclosure, there is provided a method of manufacturing a QFN packaged semiconductor device having a QFN bottom surface and QFN side faces, and comprising a die pad on the QFN bottom surface, and a plurality of I/O terminals spaced apart from the die pad around a periphery of the bottom surface, each having a bottom face extending from an inner end to a peripheral end, and an exposed side face on a one of the QFN side faces, the method comprising: attaching a die on the die pad; forming wirebonds between the die and the plurality of I/O terminals; encapsulating the die and wirebonds; forming a trench in the bottom surface, thereby exposing a part of a side face of an inner end of each of the plurality of I/O terminals; forming a second trench in the bottom surface, proximate to the peripheral end of each of the plurality I/O terminals thereby exposing a part of a side face of each of the plurality of I/O terminals, singulating the QFN semiconductor device package, thereby exposing the remainder of the side face of the I/O terminals, wherein the second trench is positioned, so as to form a recessed lower portion of the side face of the I/O terminals.

In one or embodiments the first trench and second trench are formed concurrently using a dual-blade. In one or more embodiments, a depth of the first trench is less than a depth of the second trench.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
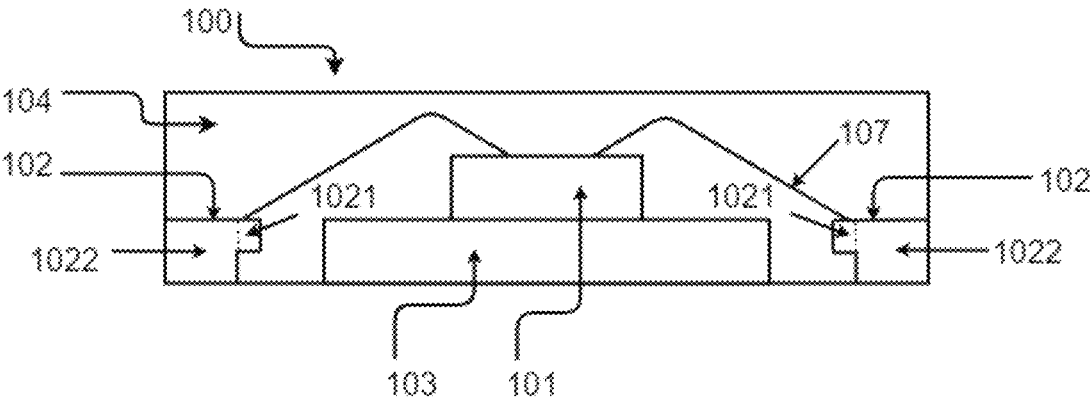
FIG. 1 is a cross-section view of a partially assembled prior art semiconductor device.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Referring now to FIG. 1, this shows a cross-section view of a quad-flat-no-leads (QFN) packaged semiconductor device. The QFN packaged semiconductor device 100 comprises: a die 101, which is typically rectangular, molding compound 104 and a singulated lead frame including I/O terminals 102 and a die pad 103. The lead frame typically comprise copper or a copper alloy. The die 101 is mounted on the die pad 103, which may also be referred to as a die paddle. The die pad is typically rectangular and may be square, and is generally larger than the die 101. The die pad is located generally centrally, that is to say it is away from the periphery of the QFN package. The I/O terminals 102 surround the die 101, typically on all four sides of the die 101 and die pad 103, and are spaced apart from, with molding compound 104 therebetween. Bond wires 107 are shown connecting bond pads on the top surface of die 101 to the I/O terminals 102. The structure is encapsulated in the molding compound 104 except on an underside of the lead frame to expose an underside of the die pad and I/O terminals. As will be familiar to the person skilled in the art of QFN packages, both of the die pad and an outer portion of each I/O terminal has a thickness corresponding to the full thickness of the lead frame. This portion may be described as having a full lead thickness and may be termed a full thickness area 1022. However, the I/O terminals may have a portion which extends in towards the die pad from the full thickness area 1022 and which does not have the full thickness area. This part of the lead frame may be thinned, typically by etching, and thus may be described as a half-etching area. The half-etched area may also be described as a buried portion 1021 of the I/O terminal, since this part of the I/O terminal is not visible viewed from the underside: there is molding compound underneath this portion. The dotted line as shown in FIG. 1, indicates a transition from the full thickness part of the I/O terminal 1022 to the buried portion 1021. Furthermore, the skilled person will be aware that although the lead frame is provided as a single component (typically on a tape reel) singulation of the packaged device results in lead being separated into multiple parts which become the die pad and individual I/O terminals lead frame.

Figure 2A:
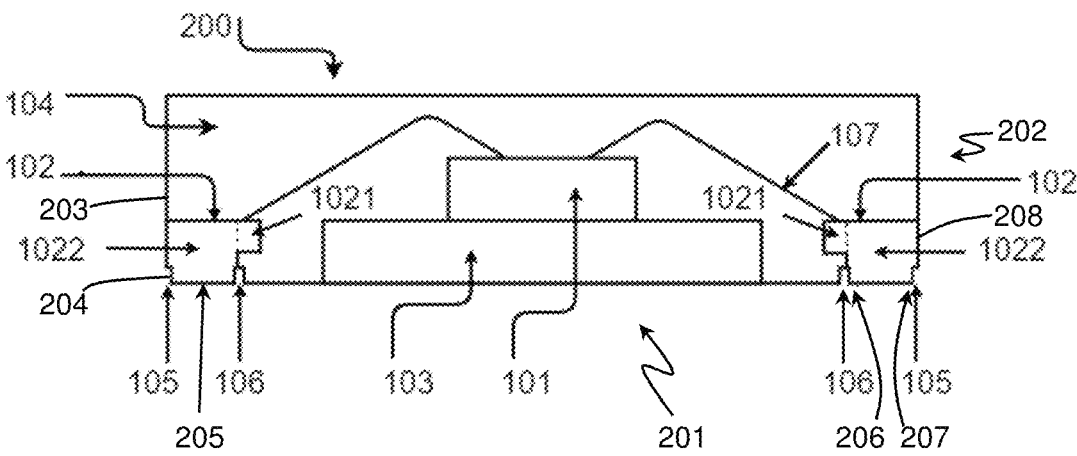
FIG. 2A is a cross-section view of a partially assembled semiconductor device according to an embodiment of the present invention.
Figure 2B:
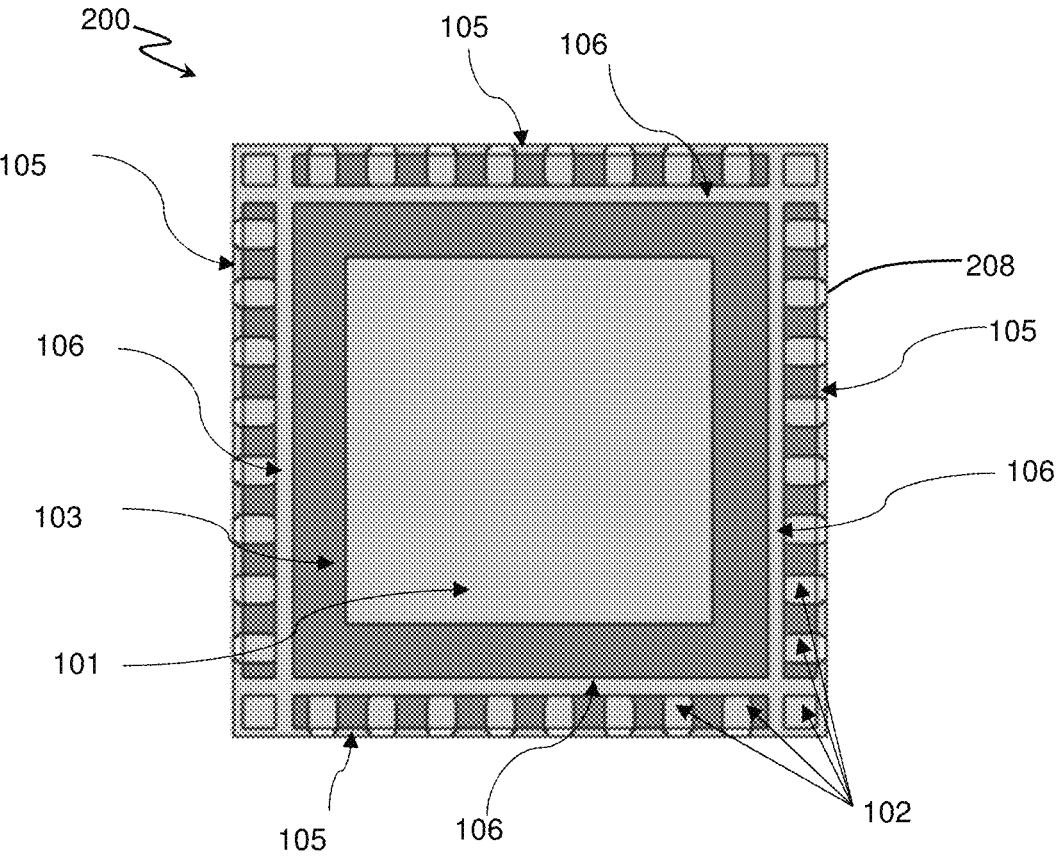
FIG. 2B is a bottom view of a partially assembled semiconductor device according to FIG. 2A.

Referring now to FIGS. 2A and 2B, these show, respectively, a cross-section view and bottom view of a QFN packaged semiconductor device 200 according to one embodiment of the present invention. The structure of the device is similar as the QFN packaged semiconductor device 100. That is to say, the quad-flat-no-leads (QFN) packaged semiconductor device 200 has a QFN bottom surface 201 and QFN side faces 202. The QFN side faces each comprise an upper portion 203 and a recessed lower portion 204. As will be described in more detail hereinbelow, the lower portions are recessed, such the perimeter around the edges of the package towards its bottom, that is to say near to the bottom surface, is smaller than the perimeter around the package towards its top surface. The recessed lower portions thus correspond to and may be considered to be notches removed from the bottom edges of the QFN packaged semiconductor device. Although the package is not drawn to scale, the lower portion 204 of each side face is smaller than the upper portion 203 of each side face. The height of the lower portion may typically be less than a full thickness of the lead frame used to construct the QFN packaged semiconductor device. The notch thus consists of removed lead frame material, to result in a notched I/O terminal. Such a notch in the I/O terminal is known to provide a "key" during soldering process.

Similarly to the device shown in FIG. 1, the QFN packaged semiconductor device 200 includes a die pad 103 on the QFN bottom surface 201. A die 101 is mounted on the die pad 103. The QFN packaged semiconductor device 200 further includes a plurality of I/O terminals 102 spaced apart from the die pad and around a periphery of the bottom surface. Each I/O terminal 102 has a bottom face 205 extending from an inner end 206 to a peripheral end 207. Each I/O terminal 102 has an exposed side face 208 on a QFN side face. As will be described in more detail hereinbelow, the exposed side face is formed primarily during the singulation of the QFN packaged semiconductor device, and comprises the cut end of the I/O terminal part of the lead frame. However, providing a recess in the QFN side face also results in a recessed lower part of the I/O terminal and this recess forms part of the side face of the I/O terminal. Thus the side face of the I/O terminal extends above the recessed lower portion of the QFN side face.

At this point it should be noted that the exposed surface of the I/O terminal which forms part of the side face of the QFN package is generally described herein as a "side face" of the I/O terminal. However, no restriction on the geometrical configuration of the I/O terminal should be imputed from the use of this term; it is equally appropriate to describe this feature as an "end face", particularly in embodiments in which the exposed surface of the I/O terminal is rectangular and has a longer dimension extending from the periphery towards the center than along the periphery of the QFN package. The terms "end face" and "side face" may thus the considered interchangeable as appropriate. Furthermore, the skilled person would also appreciate that the "side faces" of the QFN package itself could equally be designated as being "edge faces" of the package.

Returning to FIG. 2A and FIG. 2B, according to the present invention, the QFN bottom surface includes at least one trench 106 therein, parallel to a one of the QFN side faces and exposing a part of a side face of the inner end of the I/O terminals. Thus, in contrast to the QFN packaged semiconductor device shown in FIG. 1, devices according to the present invention have an increased exposed surface area of each of the I/O terminals. In a device according to FIG. 1, the exposed surface area is limited to the bottom surface of the I/O terminal (it being noted that this does not include any lower surface of half-etched parts that is to say buried portions 1021 of each I/O terminal). As mentioned above, recessing just the lower part of the edge faces of a QFN package may provide an improved key for soldering, but does not result in any increase in the exposed surface of each I/O. Furthermore, recessing just the lower part of the edge faces of a QFN package, may result in an improved key for soldering, but does not provide locking (that is to say preventing or limiting movement between the terminal and solder in either direction) of individual I/O terminals. Rather, such a QFN package relies on the keying of the I/O terminal on one edge face of the package to prevent movement in one direction, and the keying of the I/O terminals on the opposite edge face to prevent movement in the opposite direction. In contrast, according to embodiments of the invention, providing a trench which exposes a part of the side face of the inner end of the I/O terminals provides the locking function at a "per I/O terminal" level. Since solder will, in use, fill the trench (in the positions of each I/O terminal), thus contact an inner edge of each I/O terminal, and the recess on the edge face thereby surrounding three faces of each I/O terminal and preventing or limiting both backwards and forwards movement. Such a balanced lock may be hard to break. Furthermore, it also increases the solder joint area, which may strengthen the joint and make the balanced lock even harder to break.

The recessed lower portion of the edge faces, and the trench 106, may be formed by sawing. That is to say, the trench 106 may be described as a first saw lane on the inner edge of the I/O terminal 102, and the recess may be formed by a second saw lane 105 on the outer edge of the I/O terminal 102. Each of the first saw lane and second saw lane 105 can be formed by mechanical sawing or laser sawing. Mechanical sawing may be particularly convenient: since the first and second saw lanes are parallel, they may be formed in a single process that by using a dual blade saw. The separation of the blades should be chosen so as to generally correspond to the length of the exposed surface of the I/O terminals.

Figure 3A:
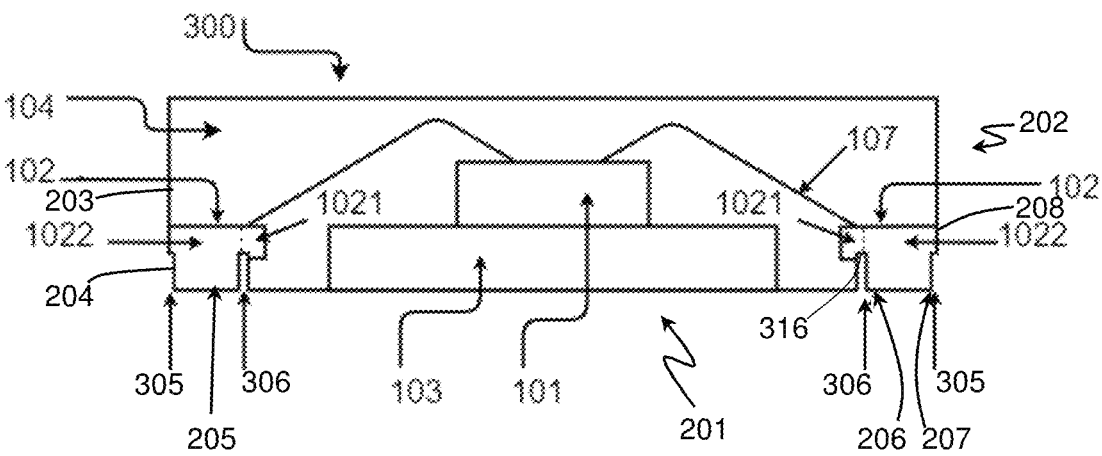
FIG. 3A is a cross-section view of a partially assembled semiconductor device according to an embodiment of the present invention.
Figure 3B:
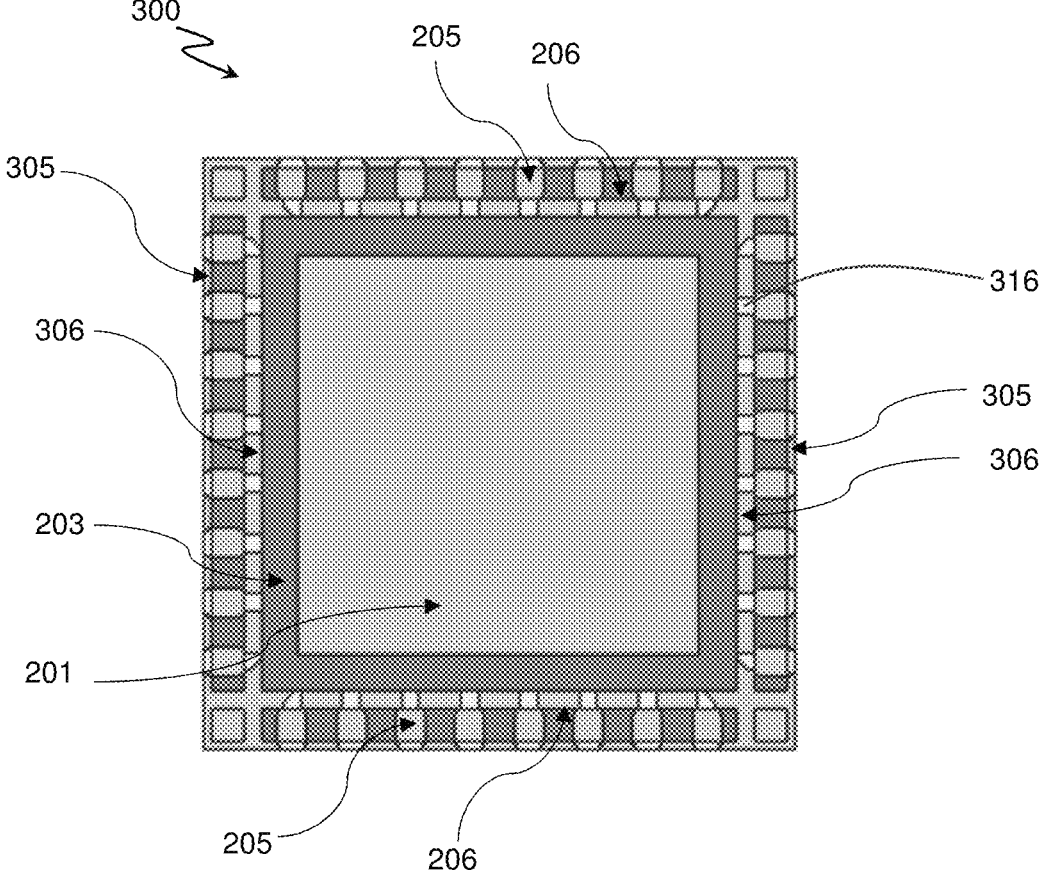
FIG. 3B is a bottom view of a partially assembled semiconductor device according to FIG. 3A.

Referring now to FIGS. 3A and 3B, these show, respectively, a cross-section view and bottom view of a QFN packaged semiconductor device 300 according to another embodiments of the present invention. The QFN packaged semiconductor device 300 is similar to that shown in FIGS. 2A and 2B, except for the depth of the trench and the height of the recessed lower portion of the QFN edge faces.

The depth of the first saw lane 306 is greater than the difference in thickness between the full lead thickness area 1022 and the thickness of the buried portion 1021 and smaller than the depth of the full lead thickness area 1022. Thus the trench not only exposes, on one wall, the whole of the side face of the inner end of the I/O terminal, but also (on its opposite wall, and on its bottom, shown at 316 in FIGS. 3A and 3B), part of the buried portion. This may be beneficial, since it may be provide a stronger lock and additional surface area to which the soldering may key.

In one embodiment of the present invention, the I/O terminals 102 of the QFN packaged semiconductor device 300 can be of any shape. The depth of the first saw lane 306 is H. The depth of the second saw lane 305 is G. The depth of each I/O terminal on the inner edge is D. H is one quarter to three quarters of D. For example, in one embodiment, H is one half of D. In one embodiment, H is one third of D. In one embodiment, H is two thirds of D. In one embodiment, $G/2 \leq H \leq 2G$. In one embodiment, H equals to G.

In another embodiment of the present invention, a method is provided for forming a semiconductor device in a quad-flat-no-leads (QFN) package having a lead frame having an array of QFN sub-assemblies each having a die arranged thereon and I/O terminals surrounding the die, comprises: encapsulating the die arranged on a topside surface of the array of QFN sub-assemblies of the lead frame; on an underside face of the QFN sub-assemblies, sawing both inner edge and outer edge of each I/O terminal, wherein the inner edge being nearer to the die pad than the outer edge being; plating the lead frame; and singulating the array of QFN sub-assemblies into individual devices. Each I/O terminal has a half-etching area and a full lead thickness area. In one embodiment, the inner edge of the I/O terminal is sawed from the full lead thickness area into the half-etching area. In one embodiment, the inner edge of the I/O terminal is sawed within the full lead thickness area. In one embodiment, the I/O terminals can be of any shape. The inner edge of the I/O terminal is sawed to a depth which is one quarter to three quarters of the depth of the inner edge of the I/O terminal.

Any range or device value given herein may be extended or altered without losing the effect sought, as will be apparent to the skilled person.

Although the invention has been described in the context of IC packages having a single die and a single electrical connector, it will be understood that the invention can be implemented in the context of IC packages having any suitable numbers of dies and any suitable numbers of electrical connectors.

Also, for purposes of this description, the terms "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Unless explicitly stated otherwise, each numerical value and range should be interpreted as being approximate as if the word "about" or "approximately" preceded the value or range.

It will be understood that various changes in the details, materials, and arrangements of the parts which have been described and illustrated in order to explain embodiments of this invention may be made by those skilled in the art without departing from embodiments of the invention encompassed by the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

It is noted that one or more embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

The invention claimed is:

1. A quad-flat-no-leads (QFN) packaged semiconductor device having a QFN bottom surface and a plurality of QFN side faces, the QFN packaged semiconductor device comprising:

a die pad within the QFN bottom surface; and a plurality of I/O terminals spaced apart from the die pad and around a periphery of the QFN bottom surface, each I/O terminal of the plurality of I/O terminals having:

a bottom face extending from an inner end to a peripheral end, and an exposed side face on a QFN side face of the plurality of QFN side faces and comprising a non-recessed upper portion extending beyond a recessed lower portion of the exposed side face, wherein the QFN bottom surface includes at least one trench therein, parallel to at least one QFN side face of the plurality of QFN side faces and exposing at least a part of a side face of the inner end of each of the I/O terminals of the plurality of I/O terminals, and each I/O terminal of the plurality of I/O terminals comprising a buried portion extending beyond the at least one trench towards the die pad and spaced apart therefrom.

2. The QFN packaged semiconductor device according to claim 1, wherein the at least one trench comprises a respective trench parallel to each of the QFN side faces of the plurality of QFN side faces.

3. The QFN packaged semiconductor device according to claim 1, wherein a depth of the at least one trench is less than a height of the recessed lower portion of the exposed side face.

4. The QFN packaged semiconductor device according to claim 1, wherein the buried portion extends from its inner end.

5. The QFN packaged semiconductor device according to claim 4, wherein each I/O terminal of the plurality of I/O terminals has a first thickness between its inner end and its peripheral end, and a second thickness, less than the first thickness, in its buried portion.

6. The QFN packaged semiconductor device according to claim 5, wherein a depth of the trench is less than a difference between the first thickness and the second thickness.

7. The QFN packaged semiconductor device according to claim 5, wherein a depth of the trench is more than a difference between the first thickness and the second thickness, and less than the first thickness.

8. A method of manufacturing a QFN packaged semiconductor device having a QFN bottom surface and QFN side faces, and comprising a die pad on the QFN bottom surface, and a plurality of I/O terminals spaced apart from the die pad around a periphery of the QFN bottom surface, each having a bottom face extending from an inner end to a peripheral end, and an exposed side face on a one of the QFN side faces, the method comprising:

attaching a die on the die pad;

forming wirebonds between the die and the plurality of I/O terminals;

encapsulating the die and wirebonds;

forming a first trench in the QFN bottom surface, thereby exposing a part of an inner side face of an inner end of each of the plurality of I/O terminals, each I/O terminal of the plurality of I/O terminals comprising a buried portion extending beyond the first trench towards the die pad and spaced apart therefrom;

forming a second trench in the QFN bottom surface, proximate to the peripheral end of each of the plurality of I/O terminals thereby exposing a part of a side face of each of the plurality of I/O terminals; and singulating the QFN semiconductor device package, thereby exposing a remainder of the side face of each of the I/O terminals, wherein the second trench is positioned so as to form a recessed lower portion of the side face of each of the I/O terminals.

9. The method of claim 8, wherein the first trench and second trench are formed concurrently using a dual-blade.

10. The method of claim 8, wherein a depth of the first trench is less than a depth of the second trench.

* * * * *